US006921944B2

United States Patent
Aoki et al.

(10) Patent No.: US 6,921,944 B2
(45) Date of Patent: Jul. 26, 2005

(54) SEMICONDUCTOR DEVICE FORMED ON A SINGLE SEMICONDUCTOR SUBSTRATE HAVING SEMICONDUCTOR ELEMENTS OPERATED AT A PREDETERMINED VOLTAGE AND A VOLTAGE LOWER THAN THAT

(75) Inventors: Hiroshi Aoki, Tokyo (JP); Junko Azami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/152,803

(22) Filed: May 23, 2002

(65) Prior Publication Data

US 2003/0006460 A1 Jan. 9, 2003

(30) Foreign Application Priority Data

Jul. 6, 2001 (JP) ........................................ 2001-205529

(51) Int. Cl.⁷ .......................... H01L 29/78; H01L 29/94
(52) U.S. Cl. ...................... 257/344; 257/327; 257/391; 257/392
(58) Field of Search .............................. 257/336–344, 257/327, 391, E21.618, 369

(56) References Cited

U.S. PATENT DOCUMENTS

| 5,532,508 | A | * | 7/1996 | Kaneko et al. ............. 257/336 |
| 5,744,372 | A | * | 4/1998 | Bulucea ....................... 437/34 |
| 5,747,855 | A | * | 5/1998 | Dennison et al. ........... 257/369 |
| 5,776,806 | A | * | 7/1998 | Dennison et al. ........... 438/199 |
| 6,020,227 | A | * | 2/2000 | Bulucea ...................... 438/194 |
| 6,078,081 | A | * | 6/2000 | Lee ............................. 257/344 |
| 6,078,082 | A | * | 6/2000 | Bulucea ...................... 257/345 |
| 6,127,700 | A | * | 10/2000 | Bulucea ...................... 257/335 |
| 6,157,062 | A | * | 12/2000 | Vasanth et al. ............. 257/336 |
| 6,316,318 | B1 | * | 11/2001 | Kapoor ....................... 438/299 |

FOREIGN PATENT DOCUMENTS

| JP | 11330267 A | | 11/1999 | |
| WO | WO 96/32747 | * | 10/1996 | ........... H01L/29/10 |

* cited by examiner

*Primary Examiner*—Nathan J. Flynn
*Assistant Examiner*—Johannes Mondt
(74) *Attorney, Agent, or Firm*—Volentine Francos & Whitt, PLLC

(57) ABSTRACT

A semiconductor device has a first semiconductor element and a second semiconductor element formed on a semiconductor substrate. The second semiconductor element is operated with a first voltage. The first semiconductor element is operated with a second voltage that is higher than the first voltage. The pairs of impurity regions of the first and second semiconductor elements respectively have first impurity areas and second impurity areas. Each of the first impurity areas have a predetermined impurity concentration and a conductivity type opposite to a conductivity type of the semiconductor substrate. The second impurity areas extend toward their corresponding gates from the first impurity areas. The second impurity areas have a same conductivity type as the first impurity areas and an impurity concentration lower than the concentration of the first impurity area.

18 Claims, 2 Drawing Sheets

SEMICONDUCTOR DEVICE FORMED ON A SINGLE SEMICONDUCTOR SUBSTRATE HAVING SEMICONDUCTOR ELEMENTS OPERATED AT A PREDETERMINED VOLTAGE AND A VOLTAGE LOWER THAN THAT

BACKGROUND OF THE INVENTION

The present invention relates to a semiconductor device having a semiconductor element operated at a predetermined operating voltage and a semiconductor element operated at an operating voltage lower than the operating voltage of the former semiconductor element. Both of the semiconductor elements are simultaneously formed on the same semiconductor substrate, and which is capable of making full use of performance of the semiconductor elements.

In general, two types of semiconductor elements different from each other in operating voltage have been built in a semiconductor device like an IC corresponding to an assembly of semiconductor elements like MOSFETs.

A technology for building a low voltage-operated field effect transistor, i.e., a low voltage transistor and a high voltage-operated field effect transistor, i.e., a high voltage transistor into a single substrate has been disclosed in, for example, Japanese Patent Application Laid-Open No. Hei 11(1999)-330267.

In order to solve a problem that arises due to the application of impurity regions of the same impurity concentration for the purpose of respective sources/drains of the low voltage transistor and the high voltage transistor, a proposal to form impurity regions of concentrations lower than those of the impurity regions for the low voltage transistor or their intermediate concentrations in the impurity regions for the low voltage transistor as extension regions has been made to the related art.

According to the related art, however, the respective pairs of impurity regions for the low voltage transistor and the high voltage transistor respectively comprise first impurity areas each indicative of a predetermined impurity concentration by an impurity indicative of a conductivity type opposite to a conductivity type of the semiconductor substrate, and second impurity areas which extend toward their corresponding gates from the first impurity areas and which indicates the same conductivity type as the first impurity areas and are indicative of impurity concentrations lower than those of the first impurity areas. When the second impurity areas are suitably set for the relaxation of an electric field applied to the high voltage transistor, an effective gate length of the low voltage transistor becomes short due to such setting and hence the low voltage transistor will incur a short channel effect.

On the other hand, when the second impurity areas are set so as not to incur the short channel effect in the low voltage transistor, the high voltage transistor is not capable of obtaining a sufficient field relaxation effect, thus resulting in incurring of a hot carrier effect in the high voltage transistor.

SUMMARY OF THE INVENTION

The present invention may provide a semiconductor device efficiently manufacturable without incurring degradation in performance in both a high voltage transistor and a low voltage transistor formed on a single substrate, and a manufacturing method thereof.

A semiconductor device according to the present invention includes a first and a second semiconductor elements formed on a semiconductor substrate, the second semiconductor element being operated at an operating voltage higher than an operating voltage of the first semiconductor element, and the first and second semiconductor elements being respectively provided with gates formed on the semiconductor substrate and pairs of impurity regions formed on the semiconductor substrate with being respectively spaced away from one another on both sides of the gates. The pairs of impurity regions of the first and second semiconductor elements respectively have first impurity areas each indicative of a predetermined impurity concentration by an impurity indicative of a conductivity type opposite to a conductivity type of the semiconductor substrate, and second impurity areas which extend toward their corresponding gates from the first impurity areas, each second impurity area indicating the same conductivity type as the first impurity areas and being indicative of an impurity concentration lower than the concentration of each first impurity area. The first impurity areas of the first semiconductor element are respectively formed with elongations which extend in directions to approach each other along the surface of the semiconductor substrate above the second impurity areas extended from the first impurity areas and which have elongated ends spaced away from each other. Further, the pair of impurity regions of the first semiconductor element respectively has third impurity areas which indicate a conductivity type opposite to the conductivity type of the second impurity areas in the impurity regions and define the second impurity areas in the impurity regions.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figures 1A, 1B, 1C, 1D, 1E, 1F:
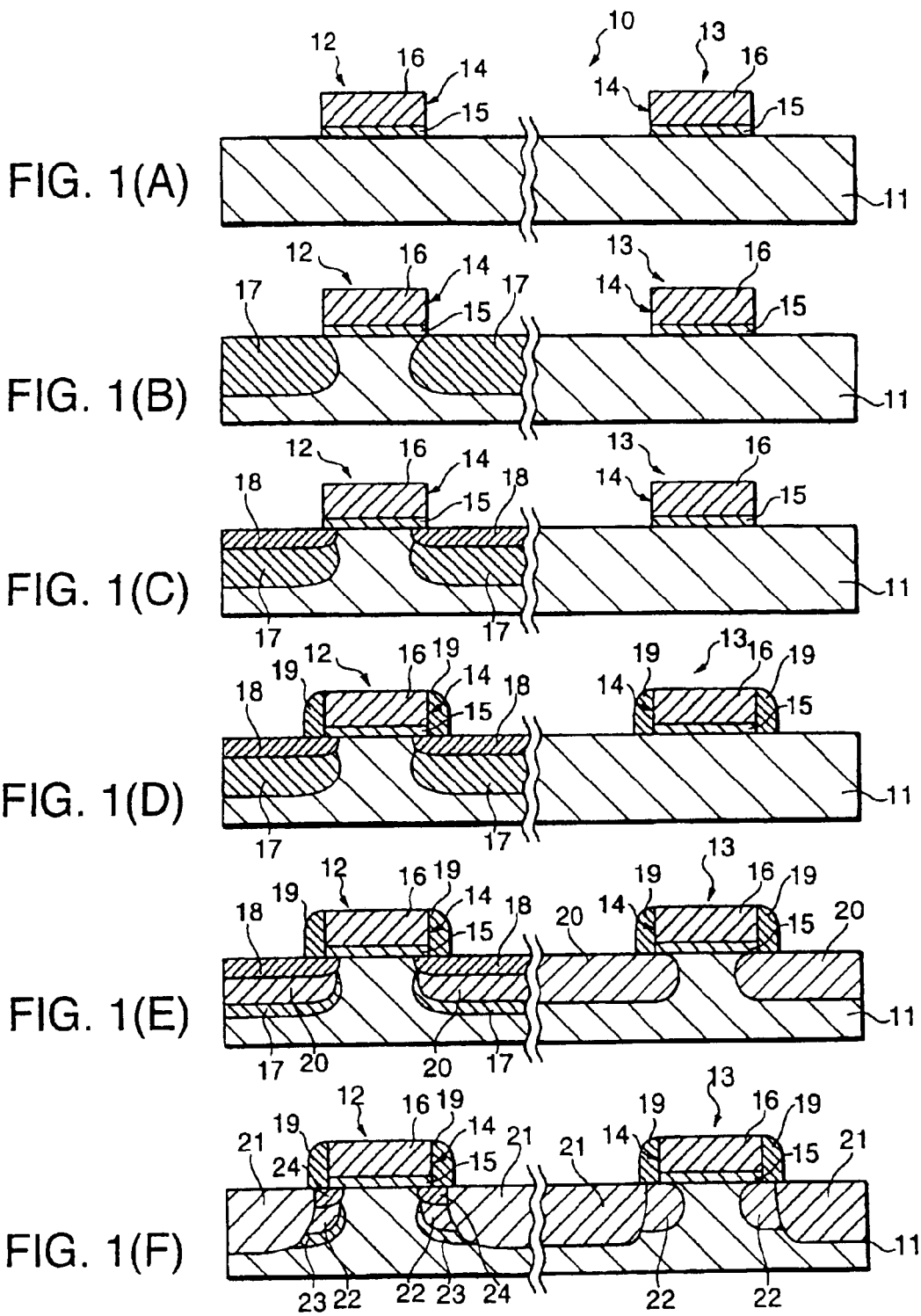
FIGS. 1(*a*) through 1(*f*) are respectively process cross-sectional views showing a method of manufacturing a semiconductor device according to the present invention.

Embodiments of the present invention will hereinafter be described by specific examples.

FIGS. 1(*a*) through 1(*f*) show a process for manufacturing a semiconductor device 10 according to the present invention. A process for efficiently manufacturing a semiconductor device including an n-type channel MOSFET, i.e., a low voltage transistor 12 provided on a semiconductor substrate 11 indicative of, for example, a p-type conductivity type corresponding to a first conductivity type and operated at a predetermined voltage, and a high voltage transistor 13 provided on the semiconductor substrate 11 and operated at a voltage higher than an operating voltage of the transistor 12, is shown in FIGS. 1(*a*) through 1(*f*).

As shown in FIG. 1(*a*), a gate 14 having a gate length of about 0.25 µm, for example, which is used for the low voltage transistor 12 corresponding to a first transistor, and a gate 14 having a gate length of about 0.35 µm, for example, which is used for the high voltage transistor 13 corresponding to a second transistor, are simultaneously formed on the semiconductor substrate 11 comprised of a p-type silicon crystal substrate by using the conventionally well-known photolithography and etching technology, for example.

As conventionally well known, each of the gates 14 has a gate insulating film 15 formed on its corresponding active region on the semiconductor substrate 11, and a gate electrode 16 formed on the gate insulating film 15. The active regions correspond to a first and a second element forming regions partitioned by an insulating film like a field oxide film formed by a LOCOS method, for example. A conventionally well-known multilayer structure can be adopted for the respective gate electrodes 16, i.e., first and second conductor patterns.

After the formation of the gates 14 of both the transistors 12 and 13, the active region for the high voltage transistor 13, i.e., the second element forming region is covered with an unillustrated mask inclusive of even the gate 14 therefor.

As shown in FIG. 1(b), for example, boron 17 indicative of the same p-type conductivity type as the conduction type of the semiconductor substrate 11 is implanted, at a predetermined depth position as viewed in the direction substantially orthogonal to the semiconductor substrate 11, in the active region, i.e., the first element forming region for the low voltage transistor 12 exposed from the mask by an ion implantation method with the gate 14 for the transistor 12 as a mask. As one example of this implanting condition, the boron was implanted therein in a concentration of about $2.0 \times 10^{13}/cm^2$ at an accelerating voltage of 20 keV.

After the boron 17 has been introduced into the active region for the transistor 12 on the semiconductor substrate 11, as shown in FIG. 1(c), arsenic 18 for achieving an increase in the flow rate of a drain current between the source and drain of the low voltage transistor 12 is implanted into the active region for the transistor 12 by the ion implantation method in a state in which the mask for covering the active region for the high voltage transistor 13 is left behind. The arsenic 18 is implanted therein shallowly as compared with the boron 17 without elongating in a gate direction from the boron 17. As one example of this implanting condition, the arsenic 18 was implanted therein in a concentration of about $1.0 \times 10^{15}/cm^2$ at an accelerating voltage of 10 keV. The arsenic 18 act as an impurity of an n type corresponding to a second conductivity type by being introduced into the semiconductor substrate 11.

After the arsenic 18 has been introduced into the active region for the transistor 12, the mask for covering the active region for the high voltage transistor 13 is removed.

After the removal of the mask, the gate 14 of the low voltage transistor 12 and the gate 14 of the high voltage transistor 13 are respectively formed with pairs of sidewalls 19 each comprised of an insulating material, which respectively sandwich the gates 14 of both transistors 12 and 13 therebetween from both sides thereof, by a conventional well-known method as shown in FIG. 1(d).

After the formation of the sidewalls 19, phosphor 20 is simultaneously implanted in both sides of the gates 14 and sidewalls 19 for the transistors 12 and 13 by the ion implantation method with the gates 14 and sidewalls 19 as masks as shown in FIG. 1(e).

The phosphor 20 is introduced therein shallowly as compared with regions for the introduction of the boron 17 introduced for the low voltage transistor 12 without elongating in the gate direction from the boron 17. As a result, regions for the introduction of the phosphor 20 for the low voltage transistor 12 are spaced away from each other and include sides that faces each other and lower surfaces extending in continuous connection with the sides, both of which are covered with the regions for the introduction of the boron 17 indicative of a conductivity type different from a conductivity type of the previously-introduced phosphor.

As one example of a condition for implanting the phosphor, the phosphor 20 was injected in a concentration of about $5.0 \times 10^{13}/cm^2$ at an accelerating voltage of 30 keV.

After the injection of the phosphor 20 into the transistors 12 and 13, arsenic (not shown) for the sources/drains is simultaneously implanted, as first ions, in the transistors 12 and 13 by the ion implantation method with the gates 14 and sidewalls 19 for the transistors 12 and 13 as the masks. As one example of this implanting condition, the arsenic 21 (see FIG. 1(f)) was implanted therein in a concentration of about $5.0 \times 10^{15}/cm^2$ at an accelerating voltage of 50 keV.

Afterwards, the respective impurity introduction regions of the semiconductor substrate 11 are subjected to a batch heat treatment to achieve the activation of the respective impurities introduced into the active regions on the semiconductor substrate 11.

The impurities 17, 18, 20 and 21 introduced into the respective transistors 12 and 13 are respectively activated owing to such a heat treatment. Therefore, as shown in FIG. 1(f), first impurity areas 21 are formed of the impurity 21, second impurity areas 22 are formed of the impurity 20 having a diffusion coefficient larger than that of the impurity 21 and injected as second ions, third impurity areas 23 are formed of the impurity 17, and elongations 24 of the impurity areas 21 are formed of the impurity 18, respectively.

Each of the pairs of impurity areas 21 formed of the arsenic 21 for the transistors 12 and 13 functions as a source and drain which are well-known in the art. In relation to the source and drain of the low voltage transistor 12, the pair of elongations 24 formed of the arsenic 18 serves so as to increase the flow rate of a drain current.

Owing to thermal diffusion of the phosphor 20 by the heat treatment, the pair of second impurity areas 22 formed of the phosphor 20 for the high voltage transistor 13 sufficiently extends in directions in which they approach each other. Therefore, an electric field applied between the source and drain of the transistor 13 is relaxed by the second impurity areas 22, thereby making it possible to bring a hot carrier effect under control.

On the other hand, the pair of second impurity areas 22 formed of the phosphor 20 for the low voltage transistor 12 is surrounded with the boron 17 indicative of the conductivity type opposite to that of each introduction region of the phosphor 20 that defines the pair of second impurity areas 22 as described above.

Therefore, the sides that face each other, of the introduction regions of the phosphor 20, undergo control over thermal diffusion in the direction to approach each other upon the heat treatment by means of the boron 17 which covers the sides. As a result, an effective channel length of the low voltage transistor 12 is prevented from shortening, whereby a short channel effect is prevented from occurring, thereby allowing prevention of a reduction in threshold value of a gate voltage due to the short channel effect. Further, since the pair of second impurity areas 22 formed of the phosphor 20 undergoes control over the elongations in the direction to move closer to each other by means of the boron 17, the effect of increasing the flow rate of the drain current by the elongations 24 is no longer impaired by the impurity areas 22.

Since the third impurity areas 23 cover the lower surfaces extended in continuous connection with the mutually faced sides of the pair of second impurity areas 22 in the low voltage transistor 12, the second impurity areas 23 can be prevented from being formed at a deep portion of the semiconductor substrate 11, whereby a short channel effect is suppressed more effectively.

Thus, according to the manufacturing method related to the present invention, it is possible to achieve an increase in the flow rate of the drain current of the low voltage transistor 12, suppress the occurrence of its short channel effect and bring the occurrence of the hot carrier effect developed in the high voltage transistor 13 into control. Therefore, the semiconductor device 10 including the transistors 12 and 13 respectively indicative of excellent electrical characteristics can be efficiently formed without incurring an increase in the number of mask process steps with no sacrifices to the electrical characteristics of both the transistors 12 and 13.

Figure 2:
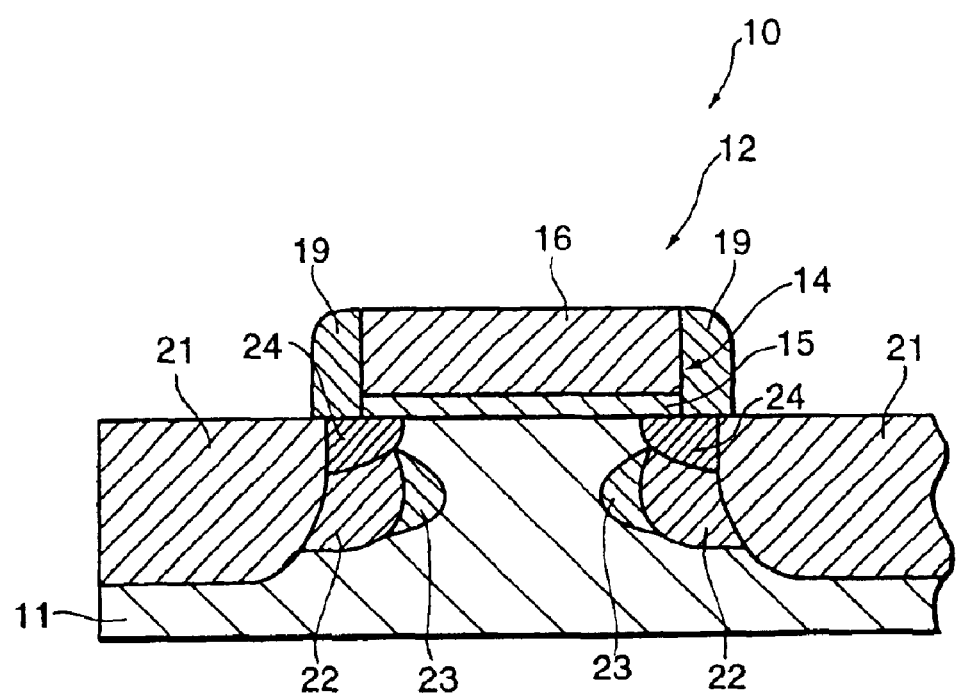
FIG. 2 is a cross-sectional view partly illustrating another specific example of a semiconductor device according to the present invention.

The first embodiment shown in FIG. 1 has described the example in which the sides and bottom faces of the second impurity areas 22 for the low voltage transistor 12 are covered with the third impurity areas 23 respectively. As an alternative to this example, there is shown a second embodiment in which only sides of second impurity areas 22 for a low voltage transistor 12 can be covered with third impurity areas 23 respectively. An impurity used for the third impurity areas 23 shown in FIG. 2 is introduced diagonally by an ion implantation method.

The second embodiment is identical to the first embodiment except for the method of introducing the impurity for the third impurity areas 23. In a manner similar to the first embodiment, the low voltage transistor 12 included in a semiconductor device 10 according to the second embodiment includes a gate 14 having a gate insulating film 15 and a gate electrode 16 used for the low voltage transistor 12, side walls 19, first impurity areas 21 each having an elongation 24, second impurity areas 22, and third impurity areas 23, all of which are provided on a semiconductor substrate 11 While a high voltage transistor is omitted for simplification of drawings in FIG. 2, the high voltage transistor is identical in configuration to the high voltage transistor 13 shown in FIG. 1.

The impurity used for the third impurity areas 23 provided for the low voltage transistor 12 is angularly introduced in diagonal directions in which they approach each other from above the semiconductor substrate 11 on both sides of the gate 14.

The impurity used for the third impurity areas 23 introduced by the oblique ion implantation method is introduced so as to extend out in a mutually closing direction as compared with the impurity for the third impurity areas 23 employed in the first embodiment.

Thus, in the second embodiment, the third impurity areas 23 can be formed so as to extend out by a large amount in directions in which they approach each other, as compared with the first embodiment in which the method of injecting the ions substantially orthogonally to the semiconductor substrate 11. Owing to the introduction of the impurity for the third impurity areas 23 by the oblique ion implantation method, the shortening of an effective channel length due to thermal process diffusion of the second impurity areas 22 can be prevented more reliably without sacrificing the electrical characteristic of the high voltage transistor in a manner similar to the first embodiment. It is also possible to more reliably prevent a reduction in the threshold value of a gate voltage applied to the low voltage transistor 12.

While the above description has been made of the method of forming the n-type channel semiconductor device on the semiconductor substrate indicative of the p-type conductivity type, a p-type channel semiconductor device can be formed on a semiconductor substrate indicative of an n-type conductivity type as an alternative to it in the same manner as described above.

While the above description has also been made of the method of introducing the impurity for the third impurity areas, the impurity for the elongations, the impurity for the second impurity areas and the impurity for the first impurity areas in order and thereafter collectively activating the respective impurities according to the heat treatment to thereby form the semiconductor device, the introduction order of the impurities and the sequence of the heat treatment for their activation, or the like may be suitably changed to form the semiconductor device as alternative to it. However, this method must comply with the introduction of the impurity for the third impurity areas into predetermined locations prior to the heat treatment of the impurity for the second impurity areas.

In the method of manufacturing the semiconductor device according to the present invention, when pairs of impurity regions for a low voltage semiconductor element and a high voltage semiconductor element are formed as described above, thermal diffusion at second impurity areas lower in impurity concentration than first impurity areas for the low voltage semiconductor element is suppressed by third impurity areas indicative of a conductivity type opposite to that of the second impurity areas. Therefore, even if the injection of the impurity for the second impurity areas is set so as to fit to the characteristic of the high voltage semiconductor element, the electrical characteristic of the low voltage semiconductor element is not impaired owing to diffusion preventing effects of the third impurity areas.

Thus, according to the manufacturing method related to the present invention, the low voltage semiconductor element and the high voltage semiconductor element both free of the occurrence of degradation in their performance can be efficiently formed on a single semiconductor substrate.

According to the semiconductor device formed by the method according to the present invention as well, elongations of the first impurity areas for the low voltage semiconductor element make it possible to achieve an increase in drain current flowing through the low voltage semiconductor element. Further, the third impurity areas allow prevention of unnecessary diffusion of the second impurity areas. It is therefore possible to suppress the occurrence of a short channel effect due to such unnecessary diffusion. On the other hand, since the second impurity areas for the high voltage semiconductor element are optimally set to relax an electric field applied to the high voltage semiconductor element, the occurrence of hot electrons can be effectively suppressed owing to the action of relaxation of the electric field in the second impurity areas, thereby making it possible to prevent degradation of an electrical characteristic due to the occurrence of the hot electrons.

Incidentally, the following embodiments are considered as applications of the present invention.

There is provided a method of manufacturing a semiconductor device having a first and a second semiconductor elements formed on a semiconductor substrate, the latter of which being operated at an operating voltage higher than an operating voltage of the first semiconductor element and both of which being respectively provided with gates formed on the semiconductor substrate and pairs of impurity regions which are respectively formed on the semiconductor substrate with being spaced away from one another on both sides of the gates, wherein the pairs of impurity regions for the first and second semiconductor elements respectively include first impurity areas each indicative of a predetermined impurity concentration by an impurity indicative of a conductivity type opposite to a conductivity type of the semiconductor substrate, and second impurity areas which extend toward their corresponding gates from the first impurity areas and each of which indicated the same conductivity type as the first impurity areas and is indicative of an impurity concentration lower than the concentrations of the first impurity areas, wherein elongations which extend in directions to approach each other along the surface of the semiconductor substrate above the second impurity areas extended from the first impurity areas and which have elongated ends spaced away from each other, are formed in the first impurity areas for the first semiconductor element, and wherein the pair of impurity regions for the first semiconductor element respectively has third impurity areas which indicate a conductivity type opposite to the conductivity type of the second impurity areas in the impurity regions and define the second impurity areas in the impurity regions, whereby the respective pairs of impurity regions are formed according to the introduction of impurities for forming the respective impurity areas into predetermined locations of the semiconductor substrate and at least one heat treatment for thermal diffusion of the introduced impurities, and an impurity for the third impurity areas is introduced into predetermined locations prior to the heat treatment of the impurity for the second impurity areas.

After the introduction of the impurities for the first, second and third impurity areas, at least one heat treatment for the thermal diffusion of the respective impurities can be collectively carried out.

The introduction of the impurities for the respective impurity regions for the first semiconductor element and the second semiconductor element can be carried out as follows:

A mask process can be effected on an element forming region for the second semiconductor element.

After the mask process, the respective impurities for the elongations and third impurity areas can be introduced into their corresponding predetermined locations.

After the respective impurities for the elongations and third impurity areas have been introduced into their predetermined locations, the mask formed on the element forming region for the second semiconductor element can be removed.

After the removal of the mask, the respective impurities can be simultaneously introduced into their corresponding predetermined locations for the first and second impurity areas used for the first and second semiconductor elements every impurities.

The introduction of the respective impurities for the elongations and third impurity areas can be carried out with the gate as a mask after the formation of the gate.

The introduction of the respective impurities for the first and second impurity areas of the first and second semiconductor elements can be performed with the gates and side walls as masks after the gates, and the side walls each formed of an insulating material with the gates interposed therebetween have been formed.

The introduction of the impurities for the impurity regions of the first and second semiconductor elements can be carried out by an ion implantation method.

Ion implantation for the third impurity areas may be oblique ion implantation for implanting ions in diagonal directions in which they approach each other from above the semiconductor substrate on both sides of the gate.

There is also provided a method of manufacturing a semiconductor device, which includes a step for forming a first conductor pattern and a second conductor pattern on a first element forming region and a second element forming region of a first conductivity type semiconductor substrate having the first and second element forming region respectively, a step for forming a mask layer on the second element forming region and introducing ions of a first conductivity type into the first element forming region with the mask layer and the first conductor pattern as masks, a step for forming side walls on the first and second conductor patterns, a step for introducing first ions of a second conductivity type and second ions which are of a second conductivity type and larger in diffusion coefficient than the first ions, into the first and second element forming regions with the first and second conductor patterns and the side walls as masks, and a step for thermally diffusing the first ions and the second ions.

The first element forming region and the second element forming region may be electrically isolated from each other by an insulating film.

The method can further include a step for introducing ions of a second conductivity type into the first element forming region with the mask layer and the first conductor pattern as masks.

Preferably, the first conductor pattern is used for a gate electrode of a first transistor, the second conductor pattern is used for a gate electrode of a second transistor, and a gate length of the first transistor is shorter than a gate length of the second transistor.

The first conductivity type ions may be introduced under the conductor patterns by being introduced with a predetermined inclination to the surface of the semiconductor substrate.

The method can further include a step for introducing the second conductivity type ions into the vicinity of the surface of the semiconductor substrate with the mask layer formed on the second element forming region and the first conductor pattern as masks.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:
   a semiconductor substrate which has a surface;
   a first low voltage transistor which is disposed on the semiconductor substrate, wherein the first low voltage transistor comprises
      a first gate portion which is formed on the semiconductor substrate,
      first and second impurity regions which are separately formed within the semiconductor substrate, wherein the first and second impurity regions extend deeply into the semiconductor substrate,
      a third impurity region which is formed between the first and second impurity regions within the semiconductor substrate, wherein the third impurity region touches the first impurity region and is formed directly below the first gate portion, a fourth impurity region which is formed between the first and second impurity regions within the semiconductor substrate, wherein the fourth impurity region touches the second impurity region and is formed directly below the first gate portion, a fifth impurity region which is formed directly below the third impurity region, wherein the fifth impurity region touches the first and third impurity regions, a sixth impurity region which is formed directly below the fourth impurity region, wherein the sixth impurity region touches the second and fourth impurity regions, a seventh impurity region which is formed between the first and second impurity regions within the semiconductor substrate, wherein the seventh impurity region covers only a side of the fifth impurity region so as to expose an underside of the fifth impurity region, and an eighth impurity region which is formed between the first and second impurity regions within the semiconductor substrate, wherein the eighth impurity region covers only a side of the sixth impurity region so as to expose an underside of the sixth impurity region; and a second high voltage transistor which is disposed on the semiconductor substrate, wherein the second high voltage transistor comprises a second gate portion which is formed on the semiconductor substrate, ninth and tenth impurity regions which are separately formed within the semiconductor substrate, wherein the ninth and tenth impurity regions extend deeply into the semiconductor substrate, an eleventh impurity region which is formed between the ninth and tenth impurity regions within the semiconductor substrate, wherein the eleventh impurity region touches the second gate portion and the ninth impurity region, and a twelfth impurity region which is formed between the ninth and tenth impurity regions within the semiconductor substrate, wherein the twelfth impurity region touches the second gate portion and the tenth impurity region, wherein the first through sixth and the ninth through twelfth impurity regions are first conductivity type regions, and the seventh and eighth impurity regions are second conductivity type regions, wherein the second conductivity type is opposite the first conductivity type.

2. The semiconductor device of claim 1, wherein the seventh impurity region covers only a side of the fifth impurity region that faces the second impurity region.

3. The semiconductor device of claim 1, wherein the eighth impurity region covers only a side of the sixth impurity region that faces the first impurity region.

4. The semiconductor device of claim 1, wherein the first, second, ninth and tenth impurity regions include arsenic ions.

5. The semiconductor device of claim 4, wherein the fifth, sixth, eleventh and twelfth impurity regions include phosphorous ions.

6. The semiconductor device of claim 4, wherein the third and fourth impurity regions include arsenic ions.

7. The semiconductor device of claim 4, wherein the seventh and eighth impurity regions include boron ions.

8. The semiconductor device of claim 1, wherein impurity concentrations of the first, second, ninth and tenth impurity regions are greater than impurity concentrations of the fifth, sixth, eleventh and twelfth impurity regions.

9. The semiconductor device of claim 1, wherein impurity concentrations of the first, second, ninth and tenth impurity regions are greater than impurity concentrations of the third and fourth impurity regions.

10. The semiconductor device of claim 1, wherein the first and second gate portions each include sidewall portions formed on respective sides thereof.

11. A semiconductor device comprising:

a semiconductor substrate which has a surface;

a first low voltage transistor which is disposed on the semiconductor substrate, wherein the first low voltage transistor comprises a first gate portion which is formed on the semiconductor substrate, first and second impurity regions which are separately formed within the semiconductor substrate, wherein the first and second impurity regions extend deeply into the semiconductor substrate, a third impurity region which is formed between the first and second impurity regions within the semiconductor substrate, wherein the third impurity region touches the first impurity region and is formed directly below the first gate portion, a fourth impurity region which is formed between the first and second impurity regions within the semiconductor substrate, wherein the fourth impurity region touches the second impurity region and is formed directly below the first gate portion, a fifth impurity region which is formed directly below the third impurity region, wherein the fifth impurity region touches the first and third impurity regions, a sixth impurity region which is formed directly below the fourth impurity region, wherein the sixth impurity region touches the second and fourth impurity regions, a seventh impurity region which is formed between the first and second impurity regions within the semiconductor substrate, wherein the seventh impurity region covers only a side of the fifth impurity region that faces the second impurity region, so that an underside of the fifth impurity region is not covered by any of the impurity regions, and an eighth impurity region which is formed between the first and second impurity regions within the semiconductor substrate, wherein the eighth impurity region covers only a side of the sixth impurity region that faces the first impurity region, so that an underside of the sixth impurity region is not covered by any of the impurity regions; and a second high voltage transistor which is disposed on the semiconductor substrate, wherein the second high voltage transistor comprises a second gate portion which is formed on the semiconductor substrate, ninth and tenth impurity regions which are separately formed within the semiconductor substrate, wherein the ninth and tenth impurity regions extend deeply into the semiconductor substrate, an eleventh impurity region which is formed between the ninth and tenth impurity regions within the semiconductor substrate, wherein the eleventh impurity region touches the second gate portion and the ninth impurity region, and a twelfth impurity region which is formed between the ninth and tenth impurity regions within the semiconductor substrate, wherein the twelfth impurity region touches the second gate portion and the tenth impurity region, wherein the first through sixth and the ninth through twelfth impurity regions are first conductivity type regions, and the seventh and eighth impurity regions are second conductivity type regions, wherein the second conductivity type is opposite the first conductivity type.

12. The semiconductor device of claim 11, wherein the first, second, ninth and tenth impurity regions include arsenic ions.

13. The semiconductor device of claim 12, wherein the fifth, sixth, eleventh and twelfth impurity regions include phosphorous ions.

14. The semiconductor device of claim 12, wherein the third and fourth impurity regions include arsenic ions.

15. The semiconductor device of claim 12, wherein the seventh and eighth impurity regions include boron ions.

16. The semiconductor device of claim 11, wherein impurity concentrations of the first, second, ninth and tenth impurity regions are greater than impurity concentrations of the fifth, sixth, eleventh and twelfth impurity regions.

17. The semiconductor device of claim 11, wherein impurity concentrations of the first, second, ninth and tenth impurity regions are greater than impurity concentrations of the third and fourth impurity regions.

18. The semiconductor device of claim 11, wherein the first and second gate portions each include sidewall portions formed on respective sides thereof.

* * * * *